(12) United States Patent
Novotny et al.

(10) Patent No.: US 6,581,388 B2
(45) Date of Patent: Jun. 24, 2003

(54) ACTIVE TEMPERATURE GRADIENT REDUCER

(75) Inventors: Shlomo Novotny, Wayland, MA (US); John Dunn, Peabody, MA (US); Marlin Vogel, Brentwood, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/995,347

(22) Filed: Nov. 27, 2001

(65) Prior Publication Data

US 2003/0097846 A1 May 29, 2003

(51) Int. Cl.[7] .................................. F25B 21/02
(52) U.S. Cl. .................. 62/3.7; 62/3.2; 62/3.4; 62/3.6
(58) Field of Search ................ 62/3.7, 3.2, 3.4, 62/3.6

(56) References Cited

U.S. PATENT DOCUMENTS

| | | | |
|---|---|---|---|
| 4,253,515 A | 3/1981 | Swiatosz ................. | 165/61 |
| 4,935,864 A | 6/1990 | Schmidt et al. ............ | 363/141 |
| 5,032,897 A | 7/1991 | Mansuria et al. ............ | 357/81 |
| 5,457,342 A | 10/1995 | Herbst, II .................. | 257/712 |
| 5,515,683 A * | 5/1996 | Kessler ..................... | 62/3.7 |
| 5,544,489 A * | 8/1996 | Moren ....................... | 62/3.64 |
| 5,712,448 A | 1/1998 | Vandersande et al. ...... | 136/203 |
| 5,761,909 A * | 6/1998 | Hughes et al. ............. | 62/3.7 |
| 5,802,856 A * | 9/1998 | Schaper et al. ............ | 62/3.7 |
| 5,865,031 A * | 2/1999 | Itakura ..................... | 62/3.7 |
| 5,918,469 A | 7/1999 | Cardella ................... | 62/3.7 |
| 5,966,940 A | 10/1999 | Gower et al. .............. | 62/3.3 |
| 5,970,719 A * | 10/1999 | Merritt .................... | 62/3.7 |
| 6,055,815 A * | 5/2000 | Peterson ................... | 62/3.7 |
| 6,094,919 A | 8/2000 | Bhatia ...................... | 62/3.7 |
| 6,193,349 B1 | 2/2001 | Cornell et al. ............. | 347/18 |
| 6,234,240 B1 | 5/2001 | Cheon ...................... | 165/80.3 |
| 6,314,741 B1 * | 11/2001 | Hiraishi ................... | 62/3.7 |

* cited by examiner

Primary Examiner—William C. Doerrler
Assistant Examiner—Mark Shulman
(74) Attorney, Agent, or Firm—Bromberg & Sunstein LLP

(57) ABSTRACT

An apparatus and method for actively reducing the temperature gradient of a substrate. The substrate is placed in thermal contact with a heat dissipation structure so as to dissipate heat from the substrate. Current is passed through a thermoelectric device, so as to provide cooling to at least one hot spot on the substrate.

36 Claims, 5 Drawing Sheets

ACTIVE TEMPERATURE GRADIENT REDUCER

TECHNICAL FIELD

The present invention relates generally to an apparatus and method for reducing the temperature gradient on a substrate, which may be an integrated circuit.

BACKGROUND OF THE INVENTION

Cooling of electronic components is becoming increasingly significant. Performance of integrated circuit components has improved dramatically over the years. Both the clock speed and density of transistors on an integrated circuit have increased significantly. Coinciding with this increase in performance is the consumption of large amounts of power, which in turn increases the amount of heat dissipated by the integrated circuit. Failure to adequately conduct this heat away from the integrated circuit ultimately leads to reduced performance and reliability of the device.

Further complicating the cooling of electronic components is that often times power dissipation and distribution is not uniform over the die of an integrated circuit, thus generating temperature "hot spots". For example, a microprocessor die may have distinct and separate areas for cache and switching. While a large amount of power is generated across the localized area of the die that performs switching, a relatively small amount of heat is generated across that portion of the die responsible for cache. As a result of this temperature gradient across an integrated circuit, signals across the die may propagate at different speeds, causing timing problems. To accommodate these timing problems, developers may be forced to reduce the temperature gradient across the die by slowing down the speed at which the integrated circuit runs.

Various cooling methodologies have been used historically to dissipate the heat generated by electronic devices. These include the use of heat sinks or cold plates, for example. Such devices typically have a planar bottom surface that makes thermal contact with the entire top surface of the integrated circuit. Consequently, the top surface of the integrated circuit is cooled in a generally uniform manner. Since design of a cooling system for an integrated circuit is typically based on the worst case surface temperature of the die, the existence of even a small number of hot spots on the die skew cooling requirements. These cooling requirements may not be achievable with these historic cooling methodologies, and typically result in a cooling implementation that is excessive for a large portion of the die.

SUMMARY OF THE INVENTION

In accordance with one embodiment of the invention, an active temperature gradient reducer is presented. The active temperature gradient reducer includes a heat dissipation structure having a contact surface. The contact surface encompasses an area for thermally contacting a substrate to be cooled. At least one thermoelectric device is incorporated into the heat dissipation structure, the thermoelectric device having at least one cooling surface for thermally contacting one or more subsections of the area.

In another embodiment of the invention, a method for actively reducing the temperature gradient of a substrate is presented. The method includes placing the substrate in thermal contact with a heat dissipation structure so as to dissipate heat from the substrate. A current is passed through a thermoelectric device incorporated into the heat dissipation device so as to provide cooling to at least one hot spot on the substrate.

In another embodiment of the invention, an active gradient temperature reducer includes a first means for dissipating heat thermally coupled to a substrate. A second means for dissipating heat is thermally coupled to at least one hot spot on the substrate, the second means for dissipating heat being thermoelectric.

BRIEF DESCRIPTION OF DRAWINGS

The foregoing features of the invention will be more readily understood by reference to the following detailed description, taken with reference to the accompanying drawings, in which.

DETAILED DESCRIPTION

An apparatus and method for reducing gradient temperature on a substrate is presented. In accordance with one embodiment of the invention, the substrate is placed in thermal contact with a heat dissipation structure so as to dissipate heat from the structure. The heat dissipation structure may be, but is not limited to, an air-cooled heat sink or a liquid-cooled cold plate. A current is passed through a thermoelectric device. The thermoelectric device, which can cool below ambient temperature (as compared to a heat sink or cold plate, which typically limits the rise of temperature above the ambient condition), is positioned so as to provide cooling to designated hot spots on the substrate, thus reducing the temperature gradient on the substrate. The thermoelectric device may be incorporated into the heat dissipation device.

Figure 1:
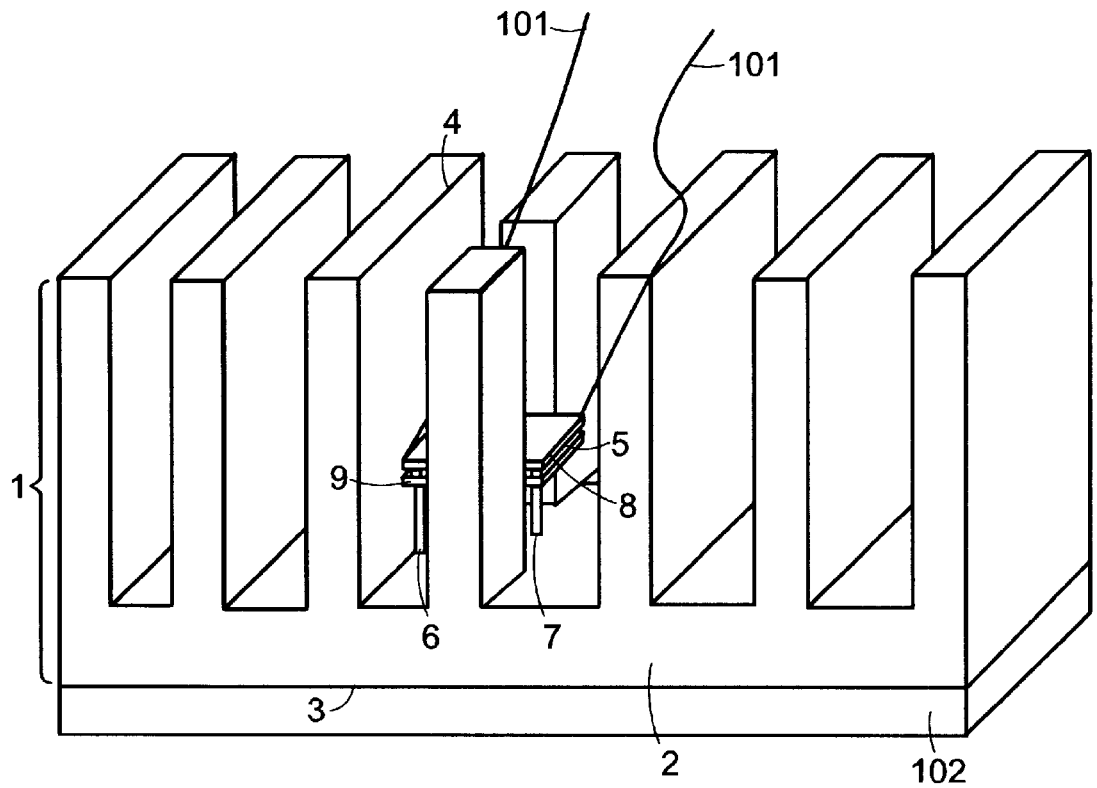
FIG. 1 is an isometric view of an active temperature gradient reducer that includes a thermoelectric device incorporated into a heat sink, in accordance with one embodiment of the invention.

FIG. 1 is an isometric perspective view of an active temperature gradient reducer 1 that includes a heat sink 2, in accordance with one embodiment of the invention. Heat sink 2 may be any conventional heat sink as known in the art, and may be manufactured using processes such as, but not limited to, stamping or casting. Heat sink 2 is generally made of a thermally conductive material, such as aluminum, copper, or bronze.

Heat sink 2 typically includes a contact surface 3 that is designed to make smooth thermal contact with a substrate 102, which may be an integrated circuit such as a microprocessor. Heat sink 2 may be attached to substrate 102 using, for example, but not limited to, adhesives or mechanical means, such as clips. To further increase the surface area for dissipating heat from the substrate 102, heat sink 2 may include one or more fins 4. Fins 4 are typically arranged such that they are longitudinally parallel with airflow, so as to maximize heat dissipation between the heat sink and the surrounding air.

Figure 2:
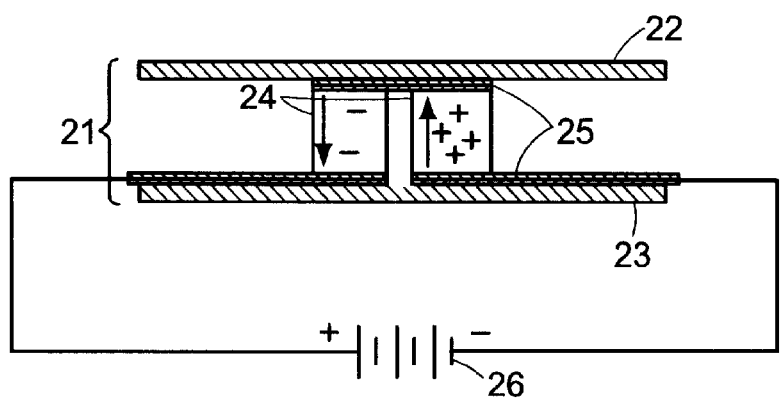
FIG. 2 is a schematic view of a typical Peltier Effect cooling device (Prior Art)

A thermoelectric device 5 is advantageously incorporated into the heat sink 2. Thermoelectric device 5 may be, but is not limited to, a Peltier Effect cooling device. FIG. 2 (prior art) is a schematic side view of a typical Peltier Effect cooling device 21. Device 21 includes a cooling surface 22 and a heat dissipation surface 23, which are typically made of ceramic. P-type and n-type semiconductor material 24, connected electrically in series by electrical conductor 25, is coupled between the two surfaces 22, 23. When a DC voltage 26 is applied to the semiconductor material 24, electrons pass from the p-type material to the n-type material and heat is transferred from the cooling surface 22 to the heat dissipation surface 23. The rate of heat transfer is proportional to the current and the number of p-n junctions.

Referring back to FIG. 1, the thermoelectric device 5 is positioned so as to cool areas of the substrate 102 encompassed by contact surface 3 of heat sink 2. These areas may include hot spots on the substrate 102. In this manner, the temperature gradient of the substrate surface can be made more uniform. Note that while the thermoelectric device 5 in FIG. 1 is orientated such that the two surfaces 22, 23 of thermoelectric device 5 are parallel with contact surface 3, other orientations are possible. For example, the thermoelectric device 5 may be orientated such that surfaces 22 and 23 are parallel to fins 33 of heat sink 32. In this manner, one entire side of heat dissipation surface 23 may be placed longitudinally in the airflow.

Figure 3:
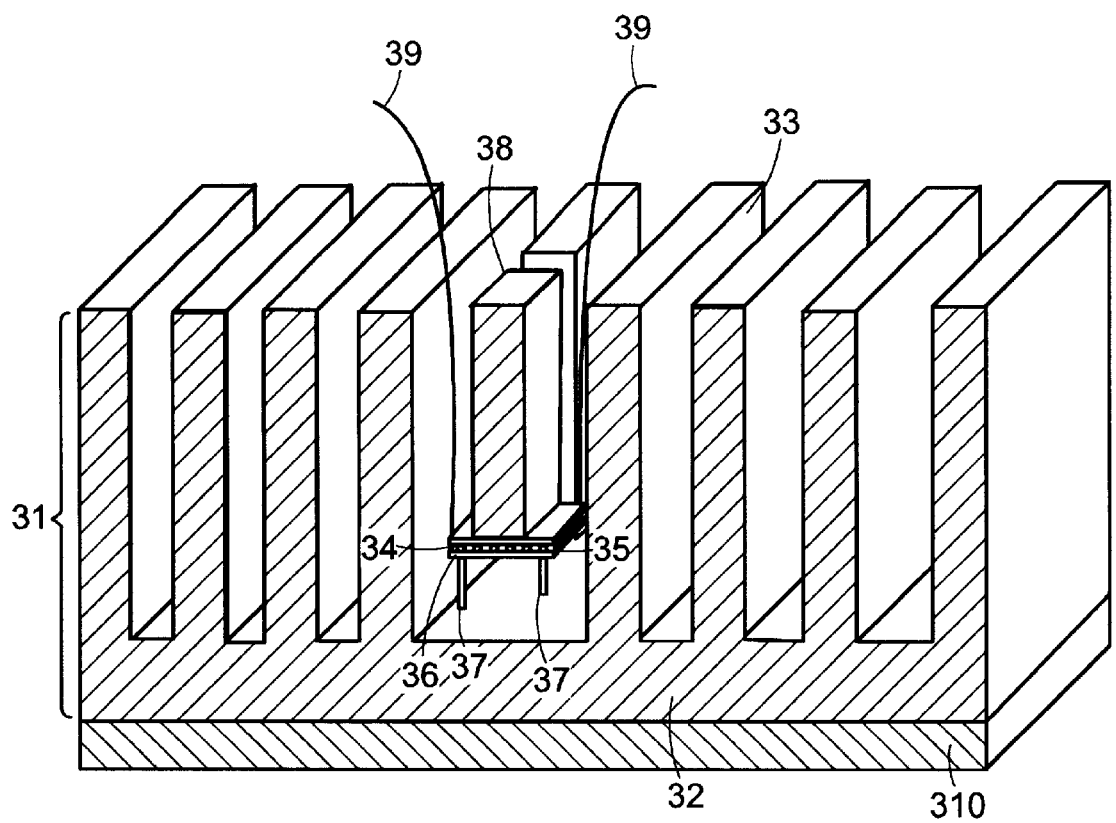
FIG. 3 is an isometric view of an active temperature gradient reducer that includes a thermoelectric device incorporated into a heat sink, in accordance with one embodiment of the invention.

As shown in FIG. 1, the at least one cooling surface of thermoelectric device 5 may be thermally coupled to at least one heat conductor 6, 7. The at least one heat conductor 6, 7 may be coupled to thermoelectric device 5 by, but not limited to, soldering or applying various adhesives/epoxies known in the art. The at least one heat conductor 6, 7 may be of various shape, such as, but not limited to, round or square pins/rods, and includes one or more surfaces for thermally contacting the substrate 102. So as to allow heat transfer between substrate 102 and the at least one cooling surface 9 of the thermoelectric 5, the at least one heat conductor 6, 7 is made of a thermally conductive material, such as, but not limited to, metal. Insulating material may be placed between various portions of the heat conductors 6, 7 and the heat sink 6 to prevent undesired thermal and electrical interaction. For similar reasons, insulating material may also be placed between various portions of the thermoelectric device 5 and the heat sink 6. Current may be supplied to the thermoelectric 5 via lead wires 101 that are connected to a power source (not shown). Note that in alternative embodiments, the at least one cooling surface of the thermoelectric device 5 may make direct thermal contact with localized hot spots of the substrate 102, without using heat conductors 6 and FIG. 3 is an isometric cross-sectional view of an active temperature gradient reducer 31 that includes a thermoelectric device 34 incorporated into a heat sink 32 in accordance with one embodiment of the invention. Thermoelectric device 34 includes a heat dissipation surface 35 and a cooling surface 36. Cooling surface 36 is attached to two heat conductors 37, 38 that penetrate heat sink 32 and make thermal contact with a substrate 310.

As can be seen in FIG. 3, both the heat sink 32 and heat dissipation surface 35 of thermoelectric device 34 may include one or more fins 33 and 38 for dissipating heat. Fins 38, or other heat conducting structures, may be attached to heat dissipation surface 35 by, but not limited to, soldering or using various adhesives known in the art. Fins 38 of thermoelectric device 34 may be aligned with fins 33 of heat sink 32, such that air can flow substantially unimpeded between the channels formed by fins 38, 33. Alternatively, fins 38 of thermoelectric device 34 may be of different size, shape, and location than fins 33. Fins 38 of thermoelectric device 34 typically do not make contact with, and are isolated from heat sink 32, so as to ensure heat emanating from heat dissipation surface 35 does not interfere with heat sink 32 cooling capabilities and vice versa. Fins 38 may be of various shape and sizes.

It is to be understood that heat sink 32 may contain one or more thermoelectric devices 34. Furthermore, the number of cooling surfaces, heat conductors, and heat dissipation surfaces associated with each thermoelectric device is variable.

Figure 4:
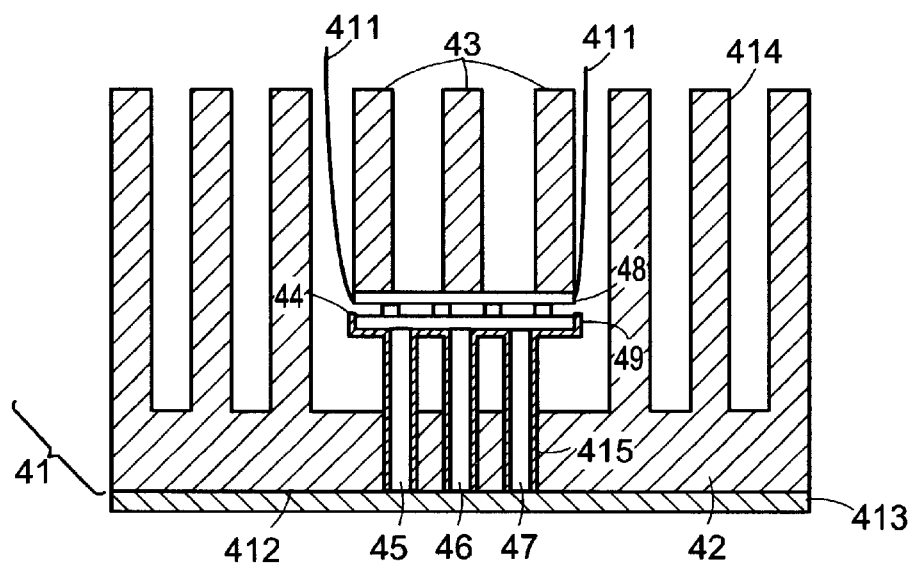
FIG. 4 is a schematic cross-sectional view of an active gradient temperature reducer that includes a thermoelectric device incorporated into a heat sink, in accordance with one embodiment of the invention.

In accordance with one embodiment of the invention, FIG. 4 is a schematic cross-sectional view of an active temperature gradient reducer 41 that incorporates at least one thermoelectric device 44 into a heat sink 42. The at least one thermoelectric device 44 includes a cooling surface 49, a heat dissipation surface 48, and wire leads 411 for supplying power to the device 44. Attached to cooling surface 49 is at least one heat conductor 45, 46, 47.

As can be seen in FIG. 4, heat sink 42 includes one or more cavities for inserting the at least one heat conductor 45, 46, 47 and/or the thermoelectric device 44. Insulating material 415 may be placed between the at least one heat conductor 45, 46, 47 and the heat sink, to prevent undesired thermal interaction. Additionally, insulating material 415 may be placed over various portions of the at least one heat conductor 45, 46, 47 and cooling surface 49 to prevent the thermoelectric device 44 from inefficiently cooling the surrounding air. One or more surfaces of heat conductors 45, 46, 47 may be placed substantially even with adjacent contact surface 412 of heat sink 42, such that both the contact surface 412 of heat sink 42 and one or more surfaces of the at least one heat conductor 45, 46, 47 thermally contact the substrate 413 to be cooled upon attaching the heat sink 42 to the substrate 413. Alternatively, at least one thermoelectric device 44 may be inserted into one or more cavities in the heat sink 42 such that cooling surface 49 directly contacts the substrate to be cooled 413.

The thermoelectric device 44 may be coupled to the heat sink 42 by attaching portions of the heat conductors 45, 56, 47, the cooling surface 49, or the insulating material to the heat sink 42 using, but not limited to, various adhesives/epoxies known in the art. Adhesives/epoxies may be selected so as to prevent unwanted interaction with heat sink 42. In alternative embodiments, thermoelectric device 44 may not be coupled to heat sink 42.

In other embodiments of the invention, heat conductors 45, 46, 47, or alternatively, cooling surface 49, may be placed such that they thermally contact heat sink 42. For example, heat conductors 45, 46, 47 may be placed directly onto the top surface of heat sink 42 so as to be above a particular hot spot on the substrate 413. However, in such embodiments, the cooling capability of the thermoelectric 44 will be inefficiently intermingled with that of the entire heat sink 42, rather than being applied to the one or more hot spots on the substrate 413 to be cooled. Heat conductors 45, 46, 47 and/or cooling surface 49 may be attached to the heat sink 42 by, but not limited to, soldering or applying various adhesives/epoxies known in the art.

Figure 5:
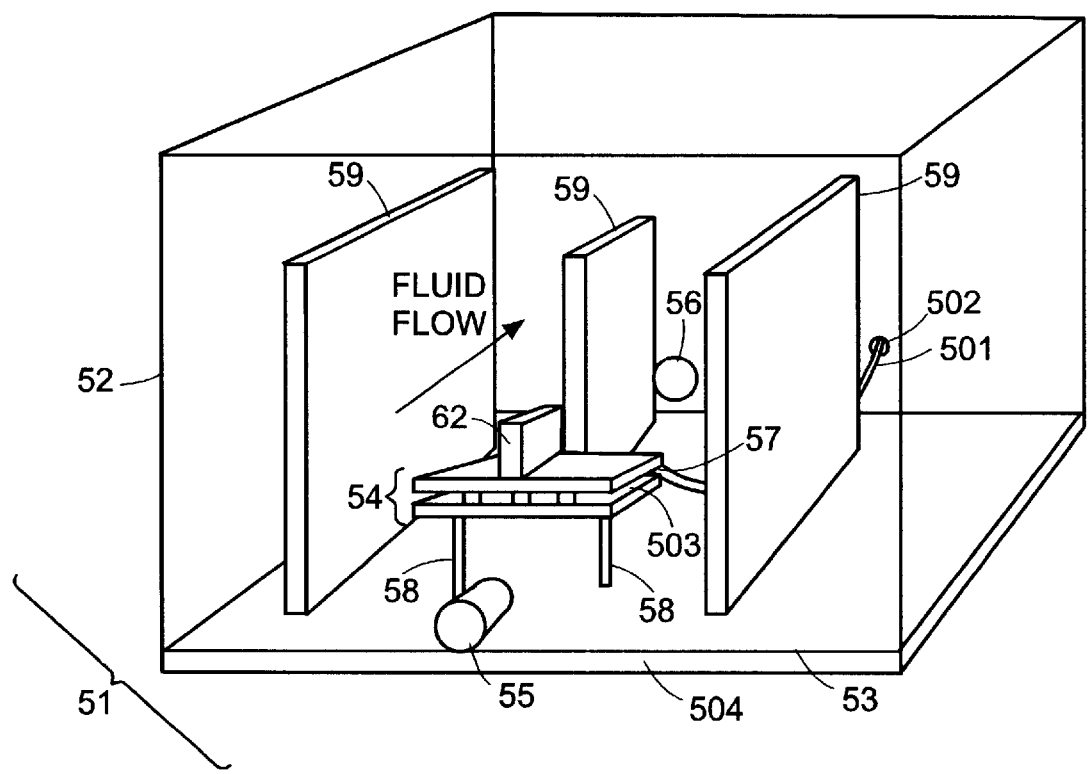
FIG. 5 is an isometric view of an active temperature gradient reducer that includes a thermoelectric device incorporated into a cold plate, in accordance with one embodiment of the invention.

In accordance with another embodiment of the invention, FIG. 5 is an isometric view of an active temperature gradient reducer 51 that includes a thermoelectric device 54 incorporated into a cold plate 52. Thermoelectric device 54 is positioned so as to cool one or more hot spots located on a substrate 504. Cold plate 52 typically has a contact surface 53 for thermally contacting the substrate 504, both a fluid inlet 55 and a fluid outlet 56, and fins 59 positioned in the fluid flow. Fins 59 are typically arranged such that they are longitudinally parallel with the fluid flow, so as to maximize heat dissipation between the cold plate 52 and the fluid. The transfer of fluid in and out of cold plate 52 acts to remove the heat transferred from the substrate 504 to cold plate 52. Cold plate 52 may be part of a fluidic circuit that also includes a pump, a heat exchanger, and a device for moving air across the heat exchanger, such as a fan or blower.

Thermoelectric device 54 includes at least one heat dissipation surface 57 and at least one cooling surface 503. At least one fin 62, or other heat conducting structure, may be attached to heat dissipation surface 57 for dissipating heat. As in above embodiments, fins 62 may be attached to heat dissipation surface 57 by, but not limited to, soldering or using various adhesives known in the art. Fins 62 of thermoelectric device 54 may be aligned with fins 59 of cold plate 52, such that fluid can flow substantially unimpeded between the channels formed by fins 59,62. Alternatively, fins 62 of thermoelectric device 54 may be of different size, shape, and location than fins 59.

Figure 6:
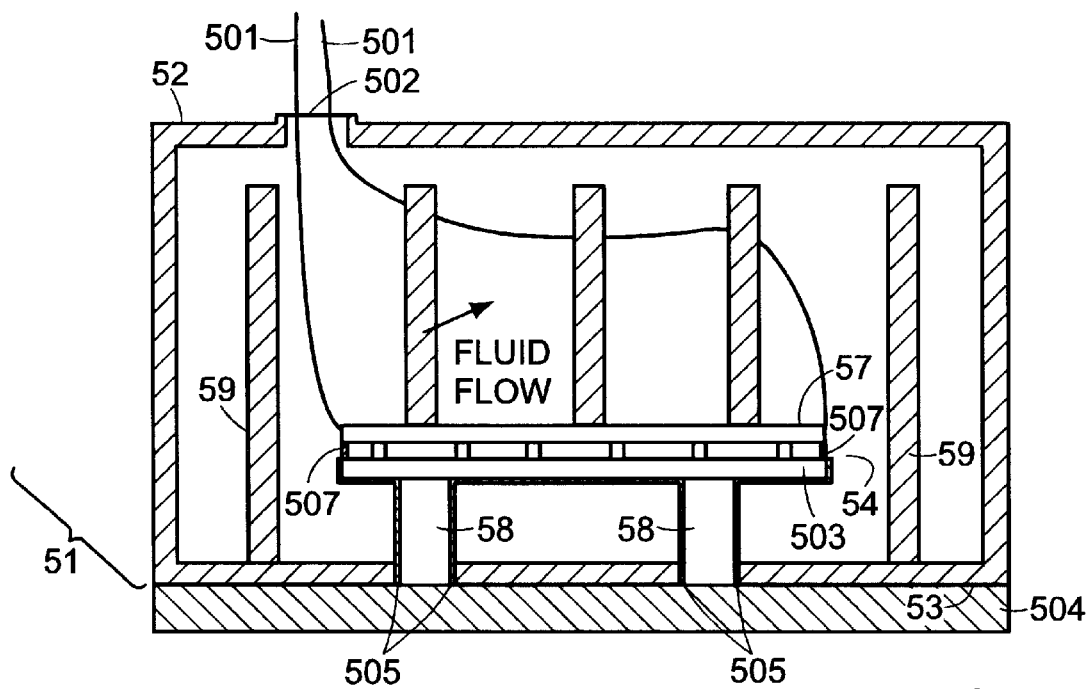
FIG. 6 is a schematic cross-sectional view of an active temperature gradient reducer that includes a thermoelectric device incorporated into a cold plate, in accordance with one embodiment of the invention.

As shown in FIG. 6, which is a cross-sectional schematic view of active gradient temperature reducer 51 incorporated into a cold plate, attached to the at least one cooling surface 503 may be one or more heat conductors 58 that have one or more surfaces for contacting substrate 504 or cold plate 52. The one or more heat conductors 58 may be coupled to thermoelectric device 54 by, but not limited to, soldering or applying various adhesives/epoxies known in the art. The one or more heat conductors 58 may be of various shape, such as, but not limited to, round or square pins/rods, and includes one or more surfaces for thermally contacting the substrate 504. The one or more heat conductors 58 are made of a thermally conductive material, such as, but not limited to, metal. Alternatively, instead of using heat conductors 58, the at least one cooling surface 503 may directly thermally contact the substrate 504 or cold plate 52. Heat conductors 58 may be attached to the cold plate 52 to form a watertight seal by, for example, soldering or various epoxies/adhesives known in the art.

Heat dissipation surface 57 may be immersed in the flow of fluid such that heat from surface 57 dissipates into the fluid. To prevent the fluid from interfering with electrical operation of the thermoelectric device 54, a non-dielectric fluid may be used. Alternatively, electrically insulating material 507 can be placed between electrically sensitive portions of the thermoelectric device (such as the semiconductor material between the hot 57 and cold 503 surfaces of the thermoelectric device 54) and the fluid.

To prevent undesired thermal interaction, thermal insulating material 505 may be placed between heat conductors 58 and the cold plate 52. Care should be taken that the surface areas of cold plate 52 that are between heat conductors 62, and that are to be cooled by the fluid flow, are properly exposed and not covered by the insulating material. Thermal insulating material 505 may also be placed between the fluid and various portions of thermoelectric device 54, such as, but not limited to, cooling surface 503 and or heat conductors 58, so as to prevent the thermoelectric device 54 from cooling the surrounding fluid.

Thermoelectric device 54 includes lead wires 501 that are attached to a power source (not shown) for supplying current to the thermoelectric device 54. A hermetic feedthrough 502, such as, but not limited to, epoxy sleeves or a hermetic connector, may be used to feed the wire through outer walls of the cold plate 52 and/or protective structure 61.

Figure 7:
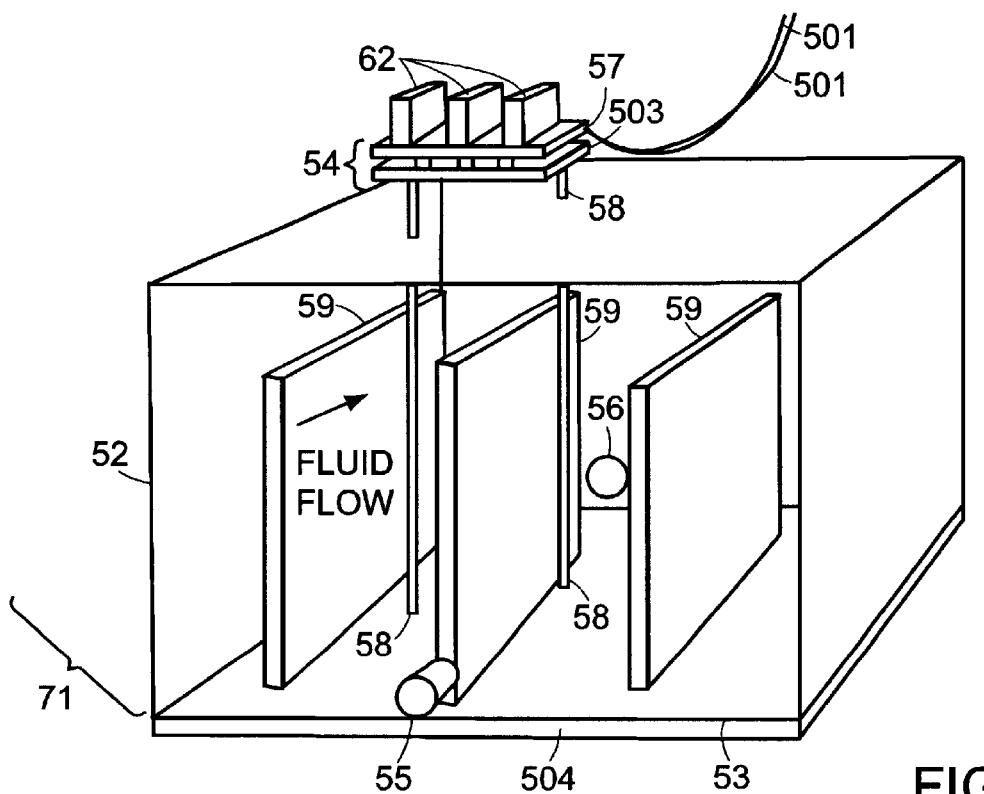
FIG. 7 is an isometric view of an active gradient temperature reducer that includes a thermoelectric device positioned external to a cold plate, in accordance with one embodiment of the invention.
Figure 8:
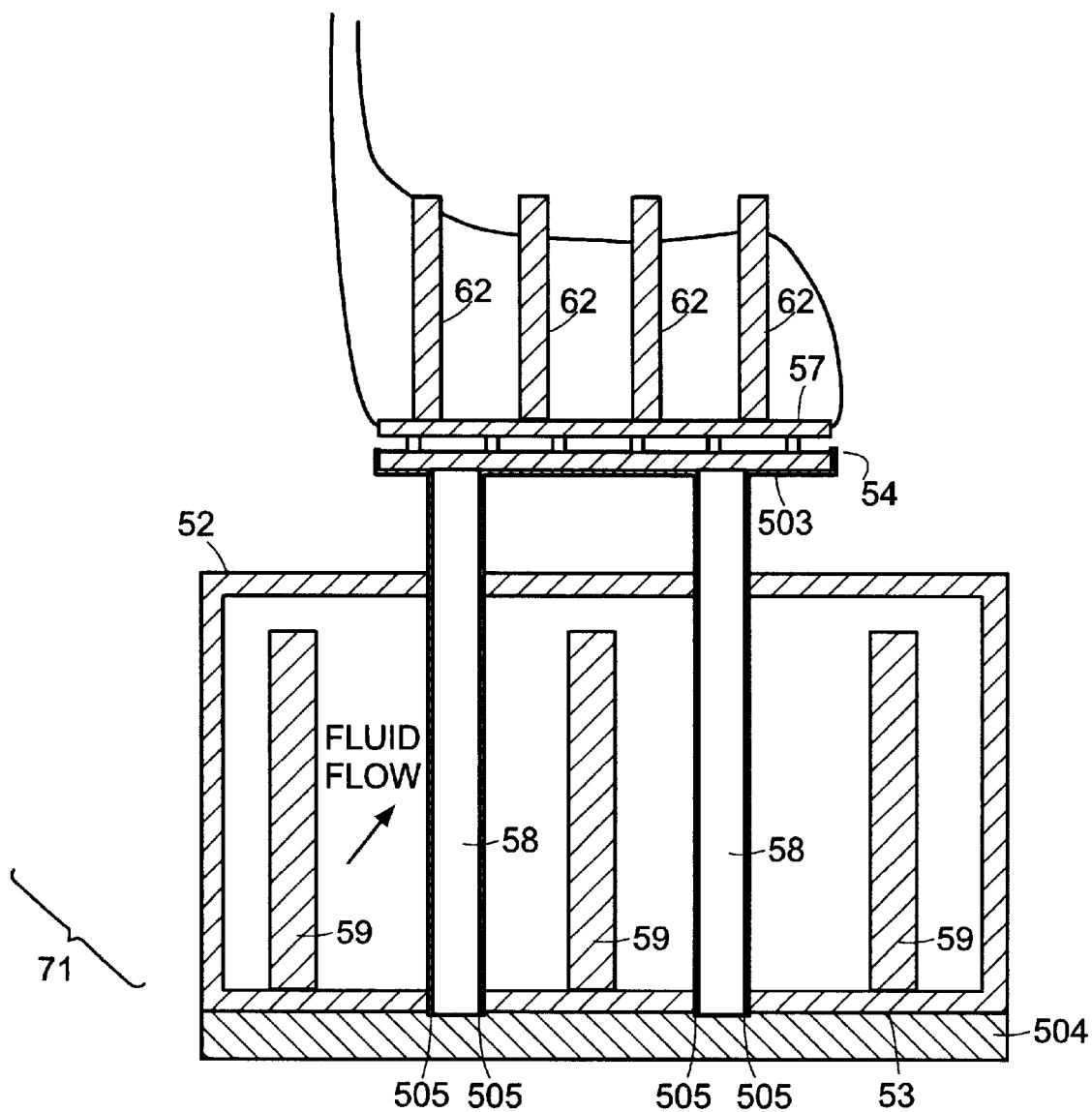
FIG. 8 is a cross-sectional view of an active gradient temperature reducer that includes a thermoelectric device positioned external to a cold plate, in accordance with one embodiment of the invention.

In accordance with another embodiment of the invention, FIG. 7 shows an isometric view of an active gradient temperature reducer 71 which includes a thermoelectric device 54 positioned external to the cold plate 52, while FIG. 8 shows a cross-sectional view of the active gradient temperature reducer 71. Thermoelectric device 54 may be positioned above, or beside, cold plate 52, for example, and in various orientations. Heat conductors 58, which are coupled to cooling surface 503 of the thermoelectric device 54, penetrate one or more surfaces of the cold plate 52 such that they make contact with the substrate to be cooled, or alternatively, the contact surface 53 of the cold plate 52. Holes may be drilled into the cold plate 52 for inserting the heat conductors 58. In this embodiment, the heating dissipation surface 57 of the thermoelectric device 54, along with fins 62, are air-cooled rather than cooled by the fluid flowing in the cold plate 52.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. An active temperature gradient reducer comprising:

a heat dissipation structure having a contact surface, the contact surface encompassing an area for thermally contacting a substrate to be cooled; and at least one thermoelectric device incorporated into the heat dissipation structure, the thermoelectric device having at least one cooling surface for thermally contacting, and providing localized cooling to, one or more subsections of the area, wherein the cooling surface is thermally insulated from the heat dissipation structure.

2. The active temperature gradient reducer according to claim 1, wherein the heat dissipation structure includes walls defining at least one cavity for inserting the thermoelectric device into the heat dissipation structure.

3. The active temperature gradient reducer according to claim 1, wherein the at least one cooling surface thermally contacts at least one hot spot on the substrate.

4. The active temperature gradient reducer according to claim 1, wherein the at least one cooling surface is substantially even with the adjacent contact surface of the heat dissipation structure.

5. The active temperature gradient reducer according to claim 1, wherein the at least one cooling surface is coupled to at least one heat conductor, the at least one heat conductor having one or more surfaces for thermally contacting the substrate to be cooled.

6. The active temperature gradient reducer according to claim 5, wherein the at least one heat conductor has one or more surfaces substantially even with the contact surface of the heat dissipation structure.

7. The active temperature gradient reducer according to claim 5, wherein the contact surface of the heat dissipation structure includes holes for inserting each heat conductor such that the one or more surfaces of each heat conductor thermally contacts the substrate.

8. The active temperature gradient reducer according to claim 5, wherein the one or more surfaces of the at least one heat conductor thermally contacts at least one hot spot on the substrate.

9. The active temperature gradient reducer according to claim 5, further comprising insulating material covering one or more surfaces of the heat conductor.

10. The active temperature gradient reducer according to claim 9, further comprising thermal insulating material placed between one or more surfaces of the at least one heat conductor and the heat dissipating structure.

11. The active temperature gradient reducer according to claim 1, further comprising thermal insulating material covering at least one portion of the cooling surface.

12. The active temperature gradient reducer according to claim 1, wherein the thermoelectric device is a Peltier Effect device.

13. The active temperature gradient reducer according to claim 1, wherein the at least one thermoelectric device causes heat to be transferred from the at least one cooling surface to at least one heat dissipation surface.

14. The active temperature gradient reducer according to claim 13, wherein the at least one heat dissipation surface is coupled to at least one heat conducting structure for dissipating heat.

15. The active temperature gradient reducer according to claim 1, wherein the substrate is an integrated circuit.

16. The active temperature gradient reducer according to claim 1, further comprising one or more wire leads which extends from each thermoelectric device for supplying power to the thermoelectric device.

17. The active temperature gradient reducer according to claim 1, wherein the heat dissipation structure is a heat sink.

18. The active temperature gradient reducer according to claim 15, wherein the heat sink includes fins for dissipating heat.

19. The active temperature gradient reducer according to claim 1 wherein the heat dissipation structure is a cold plate through which fluid flows.

20. An active temperature gradient reducer comprising:
a cold plate through which fluid flows, the cold plate having a contact surface, the contact surface encompassing an area for thermally contacting a substrate to be cooled; and
at least one thermoelectric device located inside the cold plate, the thermoelectric device having at least one cooling surface for thermally contacting, and providing localized cooling to, one or more subsections of the area.

21. The active temperature gradient reducer according to claim 20, further comprising at least one wire lead which extends from each thermoelectric for supplying power to the thermoelectric device, the wire lead extending through a hermetic feedthrough in the cold plate.

22. The active temperature gradient reducer according to claim 19, wherein the at least one thermoelectric device is located external to the cold plate.

23. The active temperature gradient reducer according to claim 22, wherein the at least one cooling surface is coupled at least one heat conductor, the at least one heat conductor for thermally contacting the substrate to be cooled.

24. The active temperature gradient reducer according to claim 23, wherein the cold plate includes holes for inserting the at least one heat conductor, such that the at least one heat conductor contacts the substrate to be cooled.

25. The active temperature gradient reducer according to claim 19, wherein dielectric fluid flows through the cold plate.

26. A method for actively reducing the temperature gradient of a substrate, the method comprising:
placing the substrate in thermal contact with a heat dissipation structure so as to dissipate heat from the substrate; and
passing a current through a thermoelectric device so as to provide localized cooling to at least one hot spot on the substrate, the thermoelectric device having a cooling surface for thermally contacting the substrate, the cooling surface thermally insulated from the heat dissipation structure.

27. A method according to claim 26, wherein the thermoelectric device is incorporated into the heat dissipation device.

28. The method according to claim 26, further comprising:
passing air across the heat dissipation device and thermoelectric device.

29. A method for actively reducing the temperature gradient of a substrate, the method comprising:
placing the substrate in thermal contact with a heat dissipation structure so as to dissipate heat from the substrate;
passing a current through a thermoelectric device so as to provide localized cooling to at least one hot spot on the substrate; and
moving liquid through the heat dissipation device such that liquid moves across a surface of the thermoelectric device.

30. An active gradient reducer comprising:
a first means for dissipating heat thermally coupled to a substrate;
a second means for dissipating heat thermally coupled to at least one hot spot on the substrate so as to provide localized cooling to the at least one hot spot, the second means for dissipating heat being thermoelectric and having a cooling surface for thermally contacting the substrate, the cooling surface thermally insulated from the heat dissipation structure.

31. The active gradient temperature reducer according to claim 30, wherein the first means for dissipating heat includes a heat sink.

32. The active gradient temperature reducer according to claim 30, wherein the first means for dissipating heat includes a cold plate through which fluid flows.

33. The active gradient temperature reducer according to claim 32, wherein the second means for dissipating heat is located inside the cold plate.

34. The active gradient temperature reducer according to claim 32, wherein the second means for dissipating heat is a Peltier cooling device.

35. The active gradient temperature reducer according to claim 34, wherein the Peltier device is located external to the cold sink.

36. An active temperature gradient reducer comprising:

a heat dissipation structure having a contact surface, the contact surface encompassing an area for thermally contacting a substrate to be cooled; and at least one thermoelectric device incorporated into the heat dissipation structure, the thermoelectric device having at least one cooling surface for thermally contacting, and providing localized cooling to, one or more subsections of the area, wherein the cooling surface is substantially even with the adjacent contact surface of the heat dissipation structure.

* * * * *